United States Patent [19]

Lauro

[11] 4,390,865
[45] Jun. 28, 1983

[54] APPARATUS FOR DIGITAL POSITION MEASUREMENTS BY A CYCLIC POSITION TRANSDUCER

[75] Inventor: Luciano Lauro, Pavone Canavese, Italy

[73] Assignee: Olivetti Controllo Numerico S.p.A., Marcianise, Italy

[21] Appl. No.: 267,910

[22] Filed: May 28, 1981

Related U.S. Application Data

[63] Continuation of Ser. No. 68,382, Aug. 21, 1979, abandoned.

[30] Foreign Application Priority Data

Aug. 31, 1978 [IT] Italy ............................ 69013 A/78

[51] Int. Cl.³ ........................................ H03K 13/02
[52] U.S. Cl. ............................ 340/347 SY; 318/660; 318/661; 328/133; 340/347 AD; 340/347 M; 364/603
[58] Field of Search .................. 340/347 M, 347 SY; 318/661; 364/603, 721, 729; 328/166, 133

[56] References Cited

U.S. PATENT DOCUMENTS 4,062,005 12/1977 Freed et al. .

OTHER PUBLICATIONS

Schmid, Synchro-to-Digital Converters, Electronic Design, vol. 18, No. 8, Apr. 12, 1970, pp. 76–79.

Primary Examiner—T. J. Sloyan
Attorney, Agent, or Firm—Edward F. McKie, Jr.

[57] ABSTRACT

For each axis, a cyclic transducer has a scale supplied with a sinusoidal signal from a timing unit and a cursor which provides two output signals which are proportional to the sine and to the cosine, within the elementary interval of the transducer. Sin $\alpha$ and cos $\alpha$ and the corresponding inverted signals are supplied to squaring circuits and logic which generates a three-bit number in a register defining the octant (000 to 111, i.e. 0 to 7) within which the electric angle $\alpha$ lies. The three-bit number controls multiplexers each having inputs for quadrants 0 to 7 and feeding respective sample and hold circuits and whose signals are NUM and DEN. An analog-to-digital converter system forms the digital value n=NUM/DEN and n along with the lowest order octant bit address a ROM which outputs the value of $\alpha$ within the range of a quadrant. A microprocessor responds to the higher two bits to create the final value of $\alpha$. The microprocessor also keeps count of the integral displacements of elementary intervals. The apparatus enables $\alpha$ to be determined instantaneously, thereby eliminating the following error of known apparatuses when $\alpha$ is changing.

3 Claims, 5 Drawing Figures

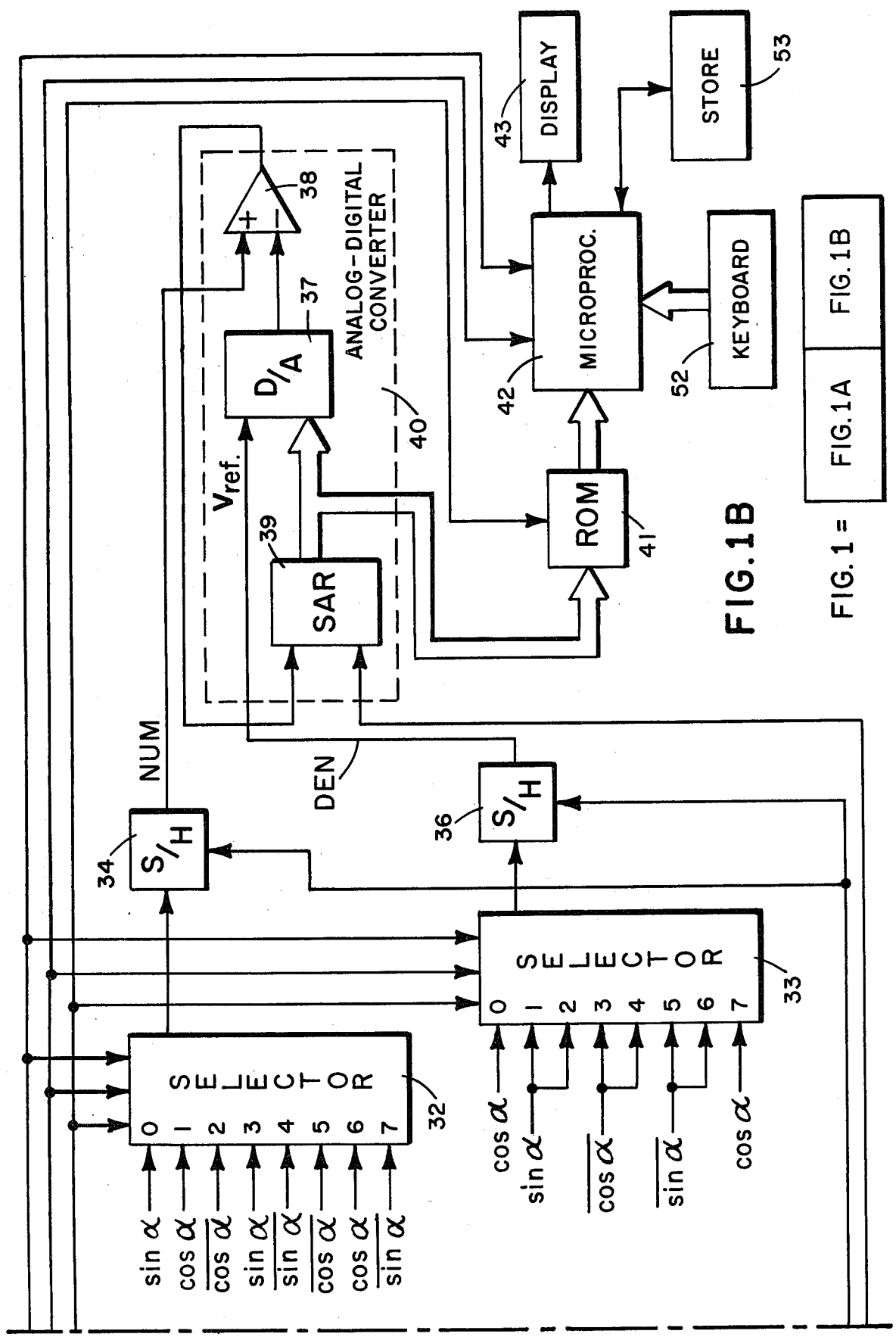

APPARATUS FOR DIGITAL POSITION MEASUREMENTS BY A CYCLIC POSITION TRANSDUCER

This application is a continuation of application Ser. No. 68,382, filed Aug. 21, 1979 now abandoned.

BACKGROUND OF THE INVENTION

The present invention relates to an apparatus for digital position measurements, comprising a cyclic position transducer which is supplied with a sinusoidal signal in order to provide at the output a pair of signals which are proportional to the sine and to the cosine of the angle corresponding to the position of measurement within the cycle of the transducer.

These apparatuses generally employ a transducer comprising a scale, provided with a single circuit in the form of a zig-zag with a predetermined elementary interval which defines the cycle of the transducer, and a cursor provided with two windings which are out of phase with respect to each other by a quarter of an elementary step. Normally these windings are supplied with signals which are proportional to the sine and the cosine, and which are generated by digital counters and digital-analog converters. The output signal on the scale, which corresponds to the error, i.e. to the difference between the position, or spot height, provided by the counters and the real position causes the counters to progress in order to reduce the error. These apparatuses have the disadvantage that the counters provide the real position with a certain delay with respect to the actual instant at which this position is reached. This is of particular disadvantage where dynamic indications of the position are being provided, since the greater the velocity of displacement, the greater the error must be, or in other words the difference between the instantaneous position indicated and the real position.

Measuring apparatuses are also known, in which the scale is supplied with a sinusoidal signal, whilst the output from the cursor consists of a pair of signals which are proportional to the sine and to the cosine of the angle within the cycle of the transducer corresponding to the position to be measured. These signals are employed for generating an error signal with respect to the position provided by a counter, as a result of which these apparatuses also suffer from the disadvantages indicated above.

SUMMARY OF THE INVENTION

The object of the invention is to provide a measuring apparatus, in which the measured position is indicated without delay and without error.

This aim is achieved in the apparatus according to the invention, comprising a logic circuit responsive to said pair of signals for defining the octants of said angle, intermediate means responsive to the output of said logic circuit and to said pair of signals for defining the analog value of the numerator and the denominator of a fraction less than 1 selectively indicating the absolute value of the tangent and the cotangent of said angle, an analog digital converter for digitally defining said value, and decoding means responsive to the digital value so defined and to the output of said logic circuit for directly indicating said angle.

The following description relates to one preferred embodiment of the invention which is given by way of example, with reference to the attached drawings in which:

FIG. 3 is a further diagram showing signals generated by the apparatus;

Figure 1A:
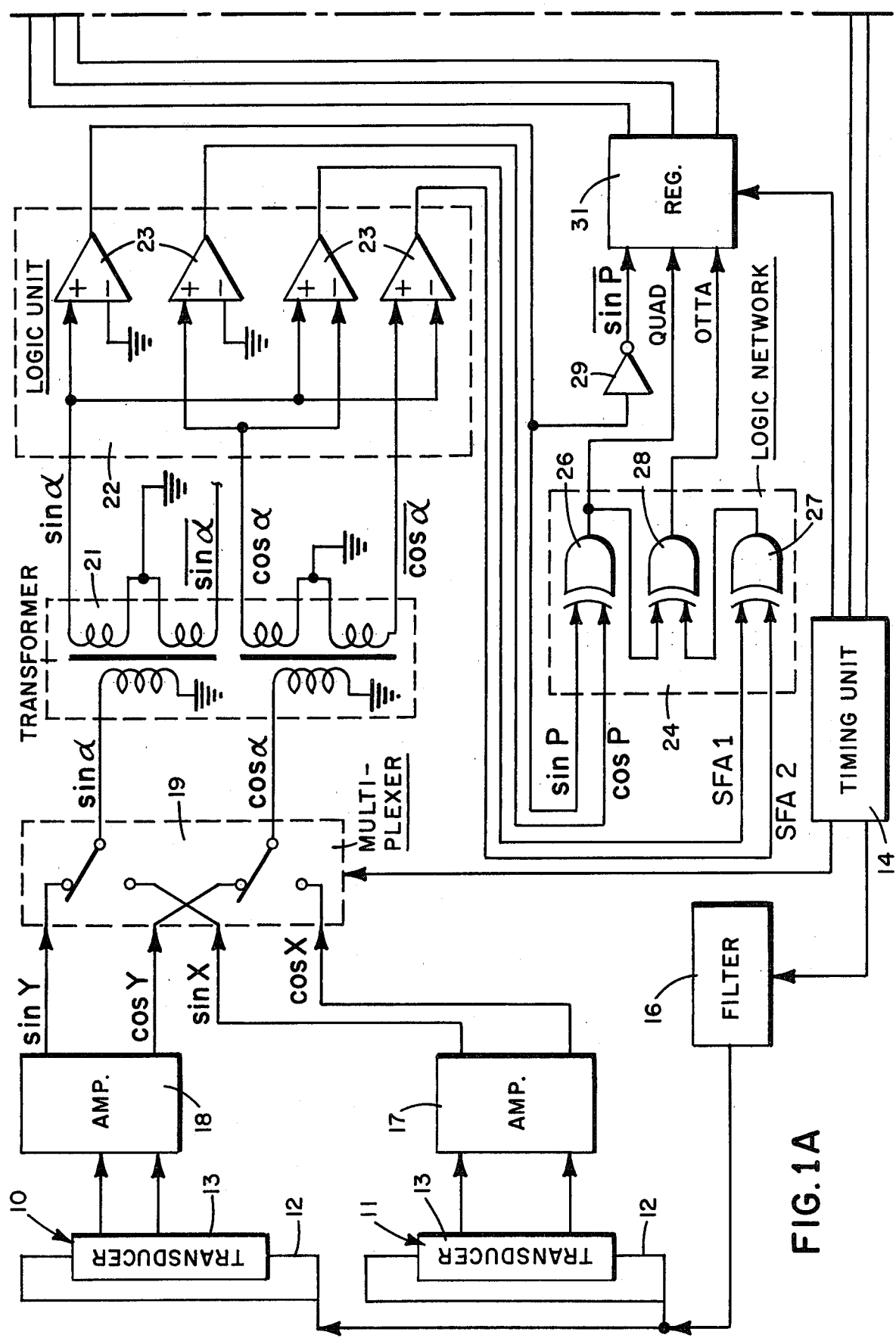
FIG. 1 is a block diagram constituted by FIGS. 1A and 1B of an apparatus for digital measurement of positions according to the invention.

The apparatus for digital measurement of positions comprises a position sensing body which is movable with respect to a piece, the exact position of which is to be measured. A transducer of a known type is provided for each one of the coordinate axes of movement of the sensing body. Two transducers 10 and 11 for the X and Y axes of displacement respectively are shown in FIG. 1A but it is obvious that the apparatus may have provision for any number of axes and consequently of transducers.

Each transducer 10, 11 comprises a scale 12 which is arranged on the fixed guide of the sensing element and is provided with a single printed circuit in the form of a zig-zag, normally having an elementary interval of 2 mm. A cursor 13 slides on scale 12 and this is arranged on the corresponding movable guide on the sensing element and is provided with two windings which are out of phase with respect to each other by a quarter of an elementary interval.

The measuring apparatus comprises a general timing unit 14, which is designed to continuously generate a square way of a predetermined frequency, for example having a period of 24 $\mu$sec. Via a filter 16 this generates a sinusoidal waveform, which supplies the scale of the two position transducers 10 and 11.

Each cursor 13 provides as an output two signals which are proportional to the sine and the cosine of the position of the cursor 13 with respect to the scale 12, within the elementary interval. These signals are amplified by two dual-channel amplifiers 17 and 18 corresponding to the two transducers 10 and 11 and are sent to a circuit for axis selection consisting of a multiplexer 19. This circuit is commanded by a timing signal provided from unit 14 and connects sequentially at its two outputs, the signals originating from amplifier 17 which are indicated by sin x and cos x and the signals originating from amplifier 18, indicated by sin y and cos y, as a result of which the multiplexer 19 on each occasion provides as an output the signals relating to one axis of measurement, which are indicated by sin $\alpha$ and cos $\alpha$.

Figure 2:
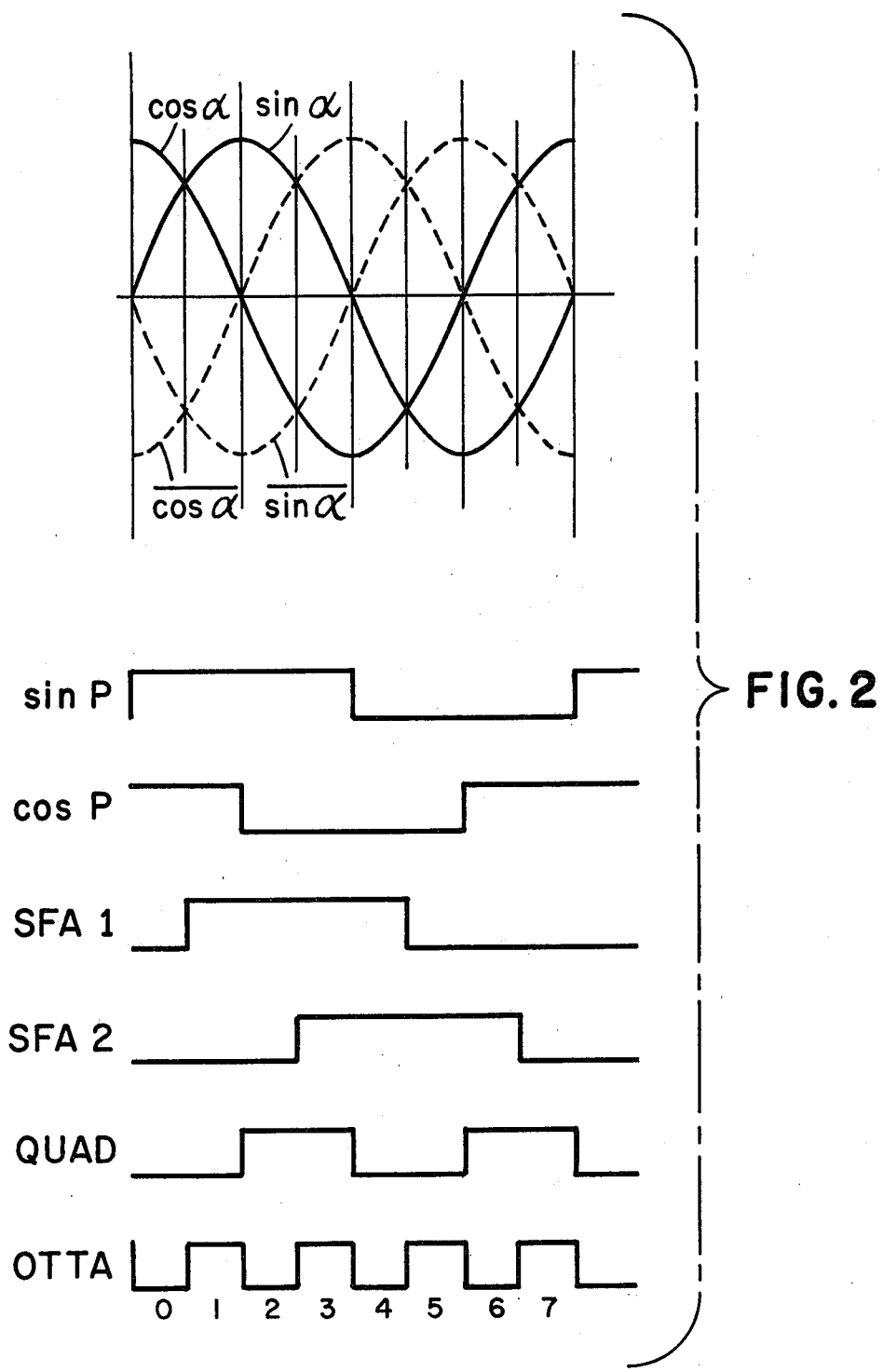
FIG. 2 shows some signals generated by the apparatus.

The measuring apparatus furthermore comprises a pair of transformers 21, the primary windings of which are supplied with the signals sin $\alpha$ and cos $\alpha$, whilst the secondary windings have earthed centre taps and provide outputs which comprise the signals $\underline{\sin \alpha}$ and $\cos \alpha$ and the corresponding inverted signals $\overline{\sin \alpha}$ and $\overline{\cos \alpha}$ (see also FIG. 2). The four output signals from the transformers 21 are supplied as inputs to a logic unit 22, comprising four square wave producing comparators or squaring circuits 23. These are connected in such a way as to produce the following square wave signals as outputs (see FIG. 2):

sinP = 1 when sin $\alpha$ > 0 and cos P = 1 when cos $\alpha$ > 0.

SFa1 = 1 when sin $\alpha$ > cos $\alpha$; SFA2 = 1 when $\overline{\cos \alpha}$ > sin $\alpha$ Consequently whilst the leading and trailing edges of sinP and cosP define the four quadrants of $\alpha$, the leading and trailing edges of SFA1 and SFA2 are out of phase by 45° with respect to the signals of the four quadrants.

The output signals from the square wave generators 23 (FIG. 1A) are fed to a logic network 24 made up by three EXCLUSIVE-OR gates 26, 27 and 28. OR gate 26 is supplied by the signals sinP and cosP and produces an output signal QUAD, which is at the low level in the first and third quadrants. OR gate 27 is supplied by the signals SFA1 and SFA2 and generates a signal which is applied, together with signal QUAD, to OR gate 28 thus generating a signal OTTA which switches level every eighth part of $2\pi$, as shown in FIG. 2.

An inverter 29 (FIG. 1A) generates signal $\overline{\text{sinP}}$ which, in combination with signals QUAD and OTTA, provides for the coding of each octant 0–7 in binary form (FIG. 2).

For this purpose the apparatus includes a register 31 formed from flip-flops and which is connected to network 24 and to inverter 29 and which is clocked by a signal originating from unit 14 to memorize the signals sinP, QUAD and OTTA. The outputs from the register 31 are connected to two selecting circuits or multiplexers 32 and 33 (FIG. 1B), which are provided with eight inputs 0–7 corresponding to the eight octants of $\alpha$ and are supplied by four signals originating from the transformers 21 according to the layout shown in FIG. 1B and in the following table:

| Octant | Selector 32 | Selector 33 |
| --- | --- | --- |
| 0 | sin$\alpha$ | cos$\alpha$ |
| 1 | cos$\alpha$ | sin$\alpha$ |
| 2 | $\overline{\cos\alpha}$ | sin$\alpha$ |
| 3 | sin$\alpha$ | $\overline{\cos\alpha}$ |
| 4 | $\overline{\sin\alpha}$ | $\overline{\cos\alpha}$ |
| 5 | $\overline{\cos\alpha}$ | $\overline{\sin\alpha}$ |
| 6 | cos$\alpha$ | $\overline{\sin\alpha}$ |
| 7 | $\overline{\sin\alpha}$ | cos$\alpha$ |

The signals provided by the register 31 make it possible to select on each occasion from the outputs from circuits 32 and 33 only the input signal at the input corresponding to the octant which is represented by it. The two signals thus selected are passed to two isolating demodulating or sampling circuits 34, 36 of the sample and hold type, and these are controlled by a timing signal from unit 14 which is taken off in order to sample or demodulate the continuous signals sin $\alpha$ and cos $\alpha$ and the negatives of these when sin $\alpha$ and cos $\alpha$ are negative. The two circuits 34 and 36 therefore generate two corresponding signals NUM and DEN, which have the purpose of respectively forming the numerator and the denominator of a fraction, the significance of which will be clear from what follows. From the above table it will be readily understood that the two signals NUM and DEN are selected in such a way as to both always be positive and in such a way that NUM is always less than DEN. It will now be clear that NUM/DEN = |tan $\alpha$| when in the octants 0, 3, 4 and 7 whilst NUM/DEN = |cot $\alpha$| when in the octants 1, 2, 5 and 6.

The signal DEN provided by circuit 36 is supplied as a reference voltage $V_{ref}$ to a digital-analog converter 37, which is adapted to provide an output signal in analog form which is equal to the product of the value $V_{ref}$ times the number n at the input, which will be seen better below. Consequently the output value from converter 37 will be $n \times V_{ref}$.

The output signal from converter 37 is sent to the non-inverting input of a comparison circuit 38. Signal NUM provided by circuit 34 is, on the other hand, delivered to the non-inverting input of the circuit 38, the output of which is connected to a counting register 39 for successive approximations (SAR). This is enabled by means of unit 14 to count for successive approximations, starting from the bit with the greatest significance, under the control of the output signal from the comparison circuit 38. The value assumed by register 39, when the output signal from circuit 38 is cancelled, is $n = \text{NUM}/V_{ref} = \text{NUM}/\text{DEN}$ and represents the digital value corresponding to the absolute analog value of the tangent or the cotangent of the angle $\alpha$, where $\alpha$ is the position at which the respective cursor 13 is located, so that the circuits 37, 38, 39 taken together and generally indicated as block 40, represents an analog-digital converter and provides directly a digital indication of the angle $\alpha$ which is representative of the position of the cursor.

The apparatus further includes a read only memory ROM 41 which is addressed when the output from circuit 38 is reset, by the bits representing the value n as an output from the register 39 and the bit of lesser significance from the register 31, which is indicative of the octant of each quadrant. The addressing bits consequently define digitally the value of the angle $\alpha$ in the range of $\pi/2$. Each addressable portion of ROM 41 records the digital value of the linear position of cursor 13. Since register 39 has 10 bits, it can provide a value of n up to 1024 as a result of which the tangent of $\alpha$ corresponding to $\frac{1}{8}$ an elementary interval is measured with a discrimination which is equal to 1/1024, and the accuracy of measurement is 0.5$\mu$. It will consequently be clear that the relative position of the cursor with respect to the scale is indicated by an electrical angle $$\alpha' = K\frac{\pi}{2} + \alpha$$

in which K is a whole number from 0 to 3 and is determined from the signals provided by the circuit 22, considering at a particular instant the polarities of signals sin $\alpha$ and cos $\alpha$, by the register 31. The position within each quarter of an elementary interval is obtained by carrying out in the converter 40 the operation $$|\tan\alpha| = \frac{|\sin\alpha|}{|\cos\alpha|} \text{ or } |\cot\alpha| = \frac{|\cos\alpha|}{|\sin\alpha|}.$$

FIG. 3 shows the timing signals provided by the timing unit 14. These are generated by an oscillator with a period of 24$\mu$ sec which generates a signal OSCI. The output signals from the multiplexer 19 are indicated by sin $\alpha$ and cos $\alpha$ which, since they have the same period as OSCI, may be out of phase with respect thereto, depending on the position of the various cursors 13. At each eight periods of signal OSCI (192 μsec), unit 14 switches multiplexer 19 from one axis to the next one.

FIG. 3 shows the time $T_1$ at which axis X is not in circuit (tranducers 10) and axis Y is in circuit, and the time $T_2$ in which axis Y is not in circuit (transducers 11) and a possible further axis is in circuit. With these insertions into circuit the output signals from the multiplexer 19 may undergo a sharp variation.

Unit 14 further generates a signal 48 for enabling the register 31 and a signal 49 for enabling the two circuits 34 and 36.

Following this, whilst multiplexer 19 is receiving signals from the transducer of the following axis, a series of ten signals from CLOCK controls the register 39 for the calculation of the value n. Finally a signal L controls reading of the position on the axis, which for axis X, terminates at time $T_2$. It will consequently be clear that the signals from one transducer are processed in order to address ROM 41, whilst those from the following transducer are received by the apparatus.

The measuring process described above is valid within the range of one elementary interval of the transducer. It is possible to take the number of steps carried out by the transducer into account between one reading and the next, if the difference between the two readings does not exceed half an elementary interval. Using the timing shown in FIG. 3 and supposing that a measuring apparatus having four axes is used, reading on each axis is carried out each $192 \times 4 = 768$ μsec $= 0.768$ msec. Consequently measurement is correct if the velocity of displacement of the cursor is less than 1 mm/0.768 ms $= 1.3$ m/sec $= 78.2$ m/min. This velocity is considerably greater than that used for displacements carried out by position pick-offs and in machine tools with digital control.

The apparatus further includes a microprocessor 42 (FIG. 1B) which is fed from ROM 41 and register 31 and has an output connected to a display unit 43 which is adapted to display the positions.

The microprocessor 42 sends on each occasion the output value from the ROM 41 to the display unit 43, together with a value which corresponds to the bits having the greater significance from register 31, which gives the quadrant in which the angle is located. Microprocessor 42 further provides the display unit 43 with a value in mm corresponding to the number of whole elementary intervals performed by the cursor with respect to a predetermined zero position. This value is temporarily stored in a suitable buffer which is not shown. In order to calculate this number of whole elementary intervals, the microprocessor 42 provides at each sampling, the difference of the value originating from ROM 41 and from register 31 with the value of the preceding sampling. If a positive difference is obtained which is greater than 1 mm, the number of whole elementary intervals to be displayed is decreased and consequently the position indicated by display unit 47 is decreased by 2 mm; if a negative difference of less than 1 mm is provided, the number of whole elementary intervals is increased. In particular, the microprocessor 42 is programmed in such a way as to perform the operations indicated in the flow diagram shown in FIG. 4. First of all the ROM 41 and register 31 are read for the position m (operation 44 in FIG. 4) then the difference between Δ the actual position and the preceding position m−1 stored in the RAM of the microprocessor (operation 46 is established. Then a sampling 47 is carried out in order to establish if the difference Δ is greater than 1 mm (half an elementary interval). Should this be the case one elementary interval i.e. 2 mm is subtracted from the value indicating the number of elementary intervals (operation 48).

Figure 4:
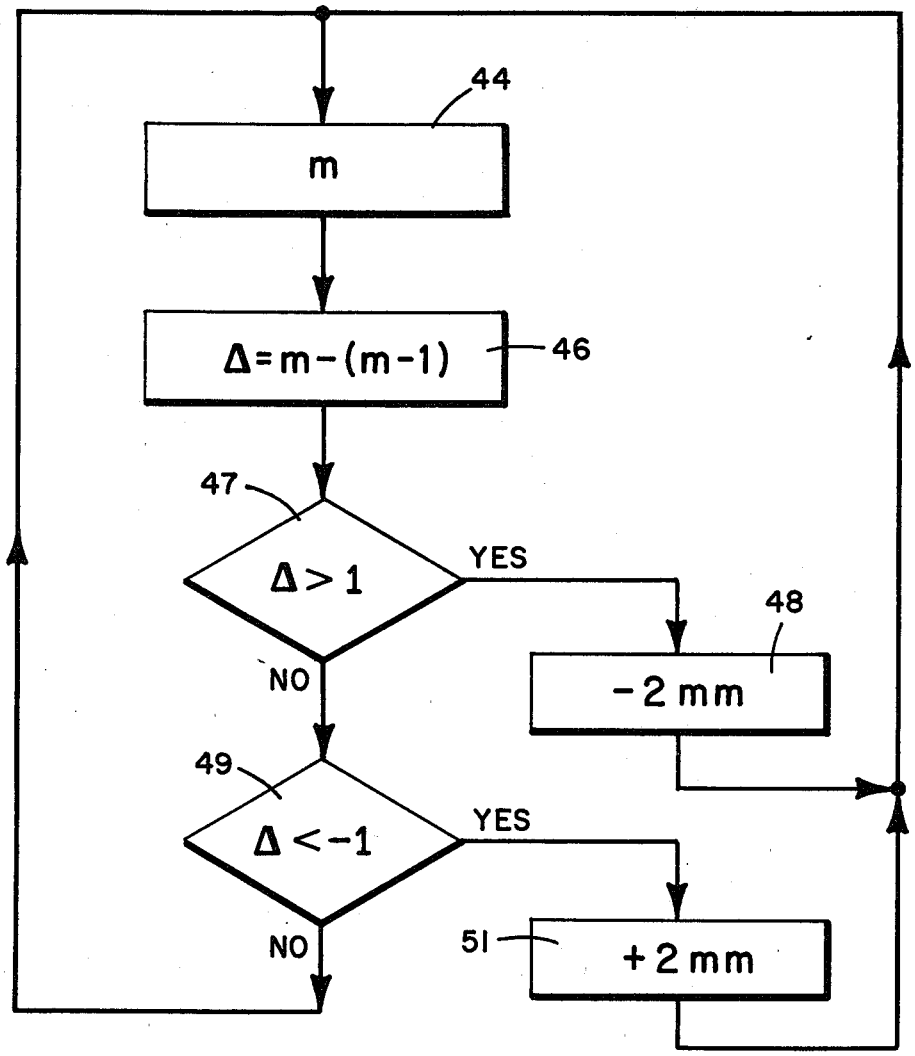
FIG. 4 is a flow chart of the operations carried out by the apparatus.

If sampling 47 provides a negative result, a further sampling 49 is carried out in order to establish if the above said difference Δ is less than −1 mm. In the affirmative case, the value indicating the number of elementary intervals is increased by 1, i.e. 2 mm is added (operation 51). Finally, if sampling 49 also yields a negative result, the number of elementary intervals remains unchanged and the routine in FIG. 4 is repeated.

The microprocessor 42 (FIG. 1B) is furthermore connected at its input to a keyboard 52 for input of data and instructions and has an output to a non-volatile store 53, which for example is a magnetic recording device or a semiconductor memory, which is supplied by a battery and is capable of maintaining a recording for a certain period of time even when the machine is switched off.

Upon switching on, the apparatus is initialized, bringing each axis to the zero position which is a position selected by a microswitch (limit switch) so as to define the zero position of the machine. By keying in a position on the keyboard which is to be assigned to this zero position, for example in order to refer measurements to a zero position on the piece, it is possible to condition the microprocessor to calculate the number of elementary intervals starting from the said position. Should it be desired to hold the said position imposed by the keyboard for subsequent uses, even in the case of periods in which the machine is not in operation, the position can be recorded in the store 53, which is then in a position to supply it to the microprocessor 42 at the time of subsequent initialization operations.

Various modifications and improvements may of course be introduced into the apparatus described without departing from the scope of the invention as claimed. For example the apparatus can be used for digital control of the displacement of a workpiece or a tool, as well as for sample measurements of position.

I claim:

1. An apparatus for digital position measurements, comprising a precision transducer having a stationary scale provided with a single zig-zag circuit, the transverse conductors of which are located at a predetermined elementary interval, and a cursor provided with a pair of windings, one out of phase with respect to the other by a quarter of said interval, said zig-zag circuit being supplied with a sinusoidal signal to cause said windings to generate as outputs a pair of signals proportional to the sine and cosine of the electric angle corresponding to the position of measurement within one interval, a circuit for supplying the complementary signals of said pair of signals, comparator means responsive to said pair of signals and said complements for producing two pairs of square waves, the waves of each pair being mutually distanced 90 degrees, one of the waves of one pair being distanced from one wave of the other pair 45 degrees, a logic network combining said square waves for producing a quadrant wave and an octant wave of the positions indicated by said transducer, within one interval, a register responsive to one of said square waves and to said quadrant and octant of said angle, a pair of multiplexers each one having an output connected to a corresponding sample hold circuit, said multiplexers being responsive to the digital code so memorized to select, according to the octant, two signals among said pair of signals and said complementary signals for causing said sample hold circuits to generate octant continuous voltages representative of the analog value of the numerator and denominator of a fraction less than 1, thus selectively indicating the absolute value of the tangent and the contangent of said electric angle, converting means for converting said absolute value into a digital value, said converting means including a digital analog converter having as a reference the value of said denominator, a comparator between said numerator and the output of said converter and a counter incremented by said comparator for supplying a digital input to said converter, whereby said digital value is obtained by successive approximations, and a read only memory addressed by the digital value so obtained and by at least part of the digital code of said register for directly indicating the position of said cursor in said interval.

2. An apparatus according to claim 1, comprising a computing unit controlled by said memory and by another part of said digital code for indicating said position irrespective from said interval.

3. An apparatus according to claim 1, wherein said transducer is of the linear type and said computer unit is connected to said read only memory and to a visual display unit, said computing unit comprising comparison means adapted to compare the values given by said read only memory in two successive cycles, said computing unit being selectively controlled by said comparison means for summing or subtracting the increment in position provided by the said comparison means and being arranged to convert the digital value obtained upon each pair of successive cycles for indicating said position by a linear distance from a fixed position.

* * * * *